US012763134B2

(12) United States Patent
Kim et al.

(10) Patent No.: US 12,763,134 B2
(45) Date of Patent: Oct. 13, 2026

(54) MEMORY DEVICE FOR BIASING DUMMY GLOBAL BITLINE

(71) Applicant: Samsung Electronics Co., Ltd., Suwon-si (KR)

(72) Inventors: Kyoungmin Kim, Suwon-si (KR); Inseok Baek, Suwon-si (KR); Donggeon Kim, Suwon-si (KR); Myeongsik Ryu, Suwon-si (KR); Sangwook Park, Suwon-si (KR); Sujin Park, Suwon-si (KR); Bokyeon Won, Suwon-si (KR); Jongmoon Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 60 days.

(21) Appl. No.: 18/538,260

(22) Filed: Dec. 13, 2023

(65) Prior Publication Data

US 2024/0363157 A1 Oct. 31, 2024

(30) Foreign Application Priority Data

Apr. 27, 2023 (KR) ........................ 10-2023-0055632

(51) Int. Cl.
*G11C 11/4094* (2006.01)
*G11C 11/4091* (2006.01)
*G11C 11/4099* (2006.01)

(52) U.S. Cl.
CPC ...... *G11C 11/4094* (2013.01); *G11C 11/4091* (2013.01); *G11C 11/4099* (2013.01)

(58) Field of Classification Search
CPC ............ G11C 11/4094; G11C 11/4091; G11C 11/4099
USPC ..................................................... 365/185.13
See application file for complete search history.

(56) References Cited

U.S. PATENT DOCUMENTS 7,923,373 B2 4/2011 Sandhu
7,943,444 B2 5/2011 Chung
7,993,961 B2 8/2011 Oh et al.
10,553,273 B2 2/2020 Ryu et al.
2008/0137393 A1 6/2008 Fukano et al.
2009/0034336 A1* 2/2009 Kwak ................ G11C 16/0483 365/185.17
2011/0026348 A1* 2/2011 Narui .................. G11C 11/4097 365/210.1
2013/0001663 A1 1/2013 Abbott et al.
2014/0022831 A1 1/2014 Kim et al.
2021/0005261 A1* 1/2021 Shin ....................... G11C 16/10

* cited by examiner

*Primary Examiner* — Anthan Tran
(74) *Attorney, Agent, or Firm* — Wolf, Greenfield & Sacks, P.C.

(57) ABSTRACT

A memory device includes first global bitlines adjacent to a first edge portion of a memory cell region, second global bitlines adjacent to a second edge portion of the memory cell region; dummy global bitlines in a central portion of the memory cell region, and a bitline sense amplifier in a sense amplifier region and connected to the first global bitlines, the second global bitlines, and the dummy global bitlines A first layer of the memory cell region is connected to a second layer of the sense amplifier region and is configured to apply a bias voltage to each of the dummy global bitlines.

10 Claims, 10 Drawing Sheets

MEMORY DEVICE FOR BIASING DUMMY GLOBAL BITLINE

CROSS-REFERENCE TO RELATED APPLICATION(S)

This application claims benefit of priority to Korean Patent Application No. 10-2023-0055632 filed on Apr. 27, 2023, in the Korean Intellectual Property Office, the disclosure of which is incorporated herein by reference in its entirety.

BACKGROUND

The present disclosure relates to a memory device for biasing a dummy global bitline.

In general, among memory devices, a dynamic random access memory (DRAM) operates in a manner of recording data by storing charge in a cell capacitor of a memory cell. A cell array of the DRAM includes blocks in which memory cells are arranged in rows and columns. A plurality of bitline sense amplifiers connected to a bitline are disposed between blocks. Data output from the bitline sense amplifier of a selected column is input to a local sense amplifier through a local data line. The local sense amplifier delivers transmitted data to an even global data line or an odd global data line.

SUMMARY

An aspect of the present disclosure is to provide a memory device for biasing a dummy global bitline.

According to an aspect of the present disclosure, a memory device according to an example embodiment of the present disclosure includes: first global bitlines adjacent to a first edge portion of a memory cell region; second global bitlines adjacent to a right edge portion of the memory cell region; dummy global bitlines in a central portion of the memory cell region; and a bitline sense amplifier in a sense amplifier region and connected to the first global bitlines, the second global bitlines, and the dummy global bitlines, wherein a first layer of the memory cell region is connected to a second layer of the sense amplifier region and is configured to apply a bias voltage to each of the dummy bitlines.

According to another aspect of the present disclosure, a memory device includes: a plurality of memory cell regions; sense amplifier regions respectively interposed between the plurality of memory cell regions; a first dummy global bitline connected to odd-numbered regions among the sense amplifier regions; and a second dummy global bitline connected to even-numbered regions among the sense amplifier regions, wherein a first layer of each of the memory cell regions is connected to a second layer of each of the sense amplifier regions and is configured to apply a bias voltage to the first dummy global bitline, and wherein the first layer of each of the memory cell regions is connected to the second layer of each of the sense amplifier regions and is configured to apply a second bias voltage to the second dummy global bitline.

According to another aspect of the present disclosure, a memory device includes: a first layer corresponding to a memory cell region; a second layer connected to a dummy global bitline; and a third layer connected to a global bitline, wherein the first layer, the second layer, and the third layer exist on a same layer, and wherein the first layer and the second layer are connected to each other, and the second layer and the third layer are connected to each other and are configured to bias the dummy global bitline.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
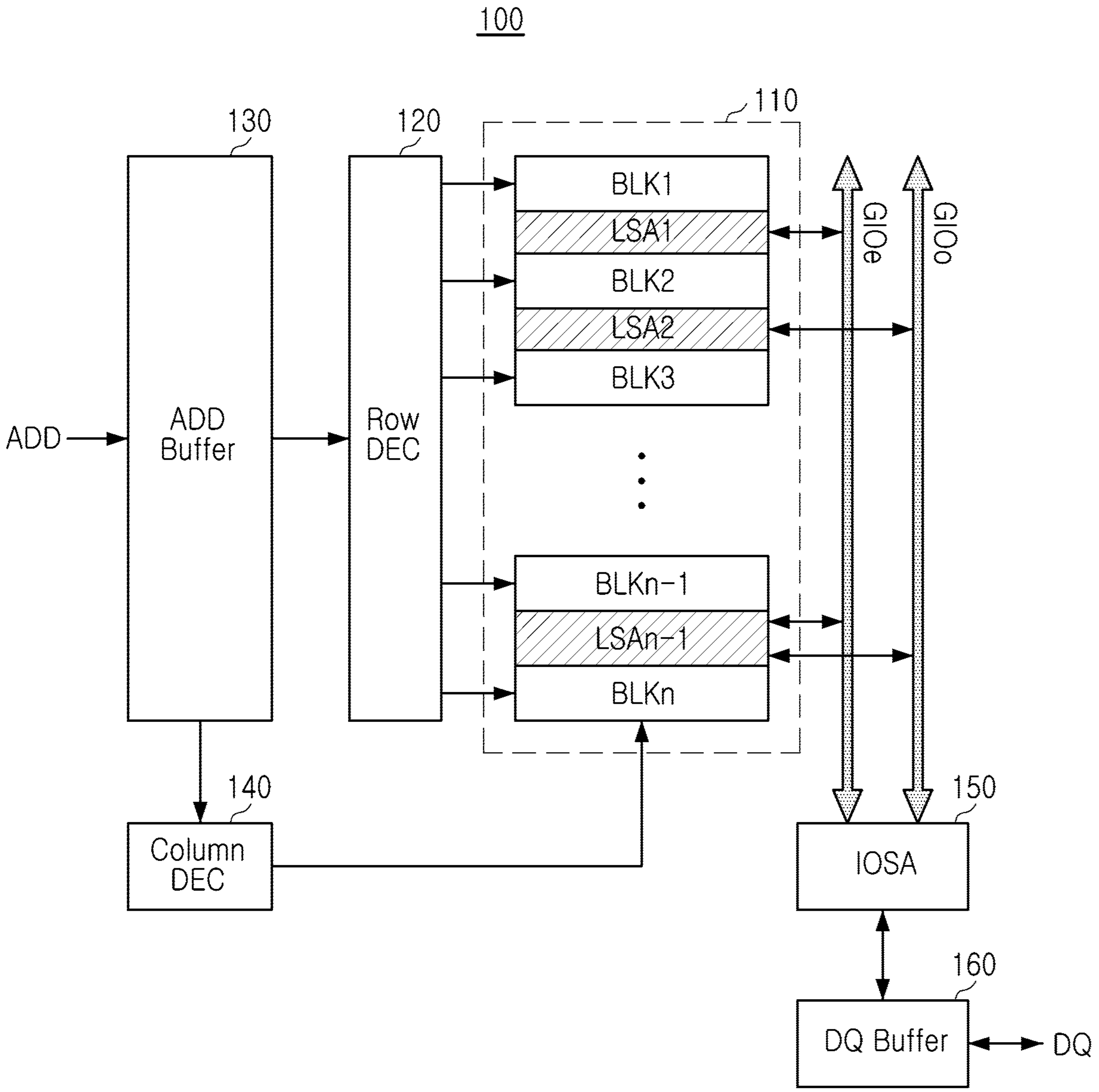
FIG. 1 is a diagram illustrating a memory device according to an example embodiment of the present disclosure.

Hereinafter, embodiments of the present disclosure will be described clearly and concisely so that those skilled in the technical field of the present disclosure can easily implement the present disclosure using the accompanying drawings. In this description, like reference numerals may indicate like components. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

A memory device according to an example embodiment of the present disclosure may be configured to perform biasing of a dummy global bitline using a memory cell layer (e.g., a land pattern layer) without a metal contact.

FIG. 1 is a diagram illustrating a memory device according to an example embodiment of the present disclosure. Referring to FIG. 1, a memory device 100 may include a cell array 110, a row decoder 120, an address buffer 130, a column decoder 140, an input/output sense amplifier 150, and a data buffer 160.

The cell array 110 may include a plurality of memory blocks BLK1 to BLKn (where n is an integer greater than or equal to 2). Each of the plurality of memory blocks BLK1 to BLKn includes a plurality of memory cells connected to word lines and bitlines. Each memory cell may include a cell capacitor and an access transistor. A gate of the access transistor may be connected to one of word lines arranged in a row direction. One end of the access transistor may be connected to a bitline or a complementary bitline arranged in a column direction. The other end of the access transistor may be connected to the cell capacitor.

A bitline sense amplifier configured to sense a bitline of a selected column may be provided between the plurality of memory blocks BLK1 to BLKn. Local sense amplifiers LSA1 to LSAn−1 configured to latch data output from the bitline sense amplifier and configured to transmit the data to global data lines GIOe and GIOo may be provided. In an example embodiment, the bitline sense amplifier may be implemented in an open bitline structure. Specifically, when a word line of the memory block (e.g., BLKn) disposed at an edge of the cell array 110 is activated, the local sense amplifier LSAn−1 may be configured to deliver the latched data to one of the global data line sets GIOe and GIOo. In a structure including the bitline sense amplifier having the open bitline structure, edge memory blocks BLK1 and BLKn may be substantially simultaneously selected. In this case, the local sense amplifier may be configured to transmit data of an edge memory block BLK1 on one side thereof to an even global data line GIOe. On the other hand, the local sense amplifier LSAn−1 may be configured to transmit data of an edge memory block BLKn on the other side thereof to an odd global data line GIOe. The opposite case is possible.

In general, adjacent local sense amplifiers (e.g., LSA1 and LSA2) may have a structure in which they are connected to different global data lines GIOe and GIOo. When the plurality of memory blocks BLK1 to BLKn are provided in an odd number, even if the edge memory blocks BLK1 and BLKn are selected at generally the same time, the local sense amplifiers LSA1 and LSAn−1 may be configured to transmit data to the different global data lines GIOe and GIOo. On the other hand, when the plurality of memory blocks BLK1 to BLKn are provided in an even number, even if the edge memory blocks BLK1 and BLKn are selected at substantially the same time, the local sense amplifiers LSA1 and LSAn−1 may be configured to transmit data to the different global data lines GIOe and GIO.

The row decoder 120 may be configured to select a word line of a memory cell to be accessed in response to an input address ADD. The row decoder 120 may be configured to decode the input address ADD to enable a corresponding word line. Furthermore, in a self-refresh operation mode, the row decoder 120 may be configured to decode a row address generated by an address counter to enable the corresponding word line. The column decoder 140 may be configured to select a bitline of a memory cell in which data is input.

The address buffer 130 may be configured to temporarily store an address ADD input from the outside, i.e., a source external to the memory device 100. The address buffer 130 may be configured to transmit the stored address to the row decoder 120 or the column decoder 140. The address ADD of an external signaling method may be converted into the address ADD of an internal signaling method of the semiconductor memory device 100 by the address buffer 130.

The input/output sense amplifier 150 may be configured to transmit write data to the cell array 110 through the global data line GIOe and GIOo, or to amplify data stored in the cell array 110 through the global data line GIOe and GIOo and transmit the data to the data buffer 160.

The data buffer 160 may be configured to store data DQ to be input from the outside (i.e., a source external to the memory device 100) or output to the outside (i.e., a destination external to the memory device 100). The input data stored in the data buffer 160 may be transmitted to the cell array 110 through the input/output sense amplifier 150. Furthermore, the data buffer 160 may be configured to transmit data read from the cell array 110 to the outside of the memory device 100 (i.e., a destination external to the memory device 100). The data buffer 160 may further include driver circuits configured to exchange data DQ with the outside (i.e., a destination external to the memory device 100).

Figure 2:
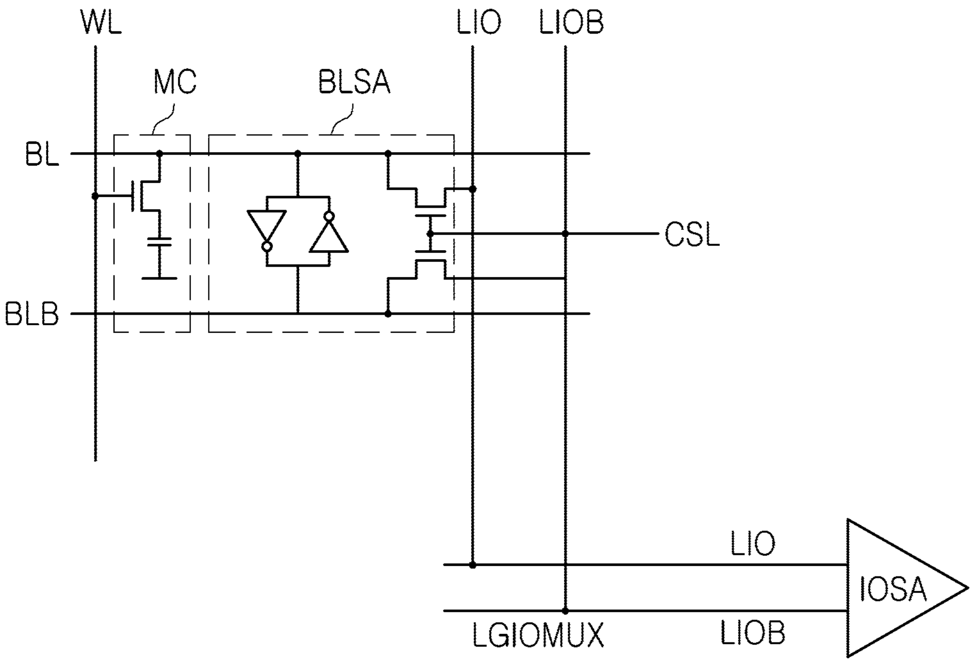
FIG. 2 is a circuit diagram conceptually illustrating a sensing operation of the memory cell of FIG. 1.

The memory device 100, according to an example embodiment of the present disclosure, can be structured into separate even/odd local input/output lines. More specifically, the memory device 100 may be configured to bias a dummy global bitline in a local input/output separation region within a bitline sense amplifier. Here, the biasing of the dummy global bitline can be carried out by connecting to a dummy line (e.g., LP_DAM) in a memory cell region, rather than by using a metal connection FIG. 2 is a circuit diagram conceptually illustrating a sensing operation of the memory cell of FIG. 1. Referring to FIGS. 1 and 2, a memory cell MC included in a memory cell array may be connected to a word line WL and a bitline BL.

The memory cell MC may include a cell transistor and a cell capacitor. The memory device 100 may be configured to perform a read operation or a refresh operation based on a charge amount of the cell capacitor C included in the memory cell MC. In this case, the first bitline BL connected to the memory cell MC is precharged with a precharge voltage. Then, as the word line WL is activated, a charge sharing operation occurs between a charge of the bitline BL charged with the precharge voltage and a charge of the cell capacitor of the memory cell MC. A voltage of the bitline BL may decrease or increase by a voltage change amount from the precharge voltage due to the charge sharing operation. The bitline sense amplifier BLSA may sense and amplify the voltage change amount. The bitline sense amplifier BLSA may transmit the amplified voltage to a local input/output line LIO and a complementary local input/output line LIOB in response to a voltage applied to a column selection line CSL. An input/output sense amplifier IOSA may sense a potential difference between the local input/output line LIO and the complementary local input/output line LIOB.

In an example embodiment, the bitline sense amplifier BLSA may be implemented to perform different biasing according to the even/odd local input/output line. Such biasing may be performed by applying a bias voltage corresponding to the dummy global bitline.

Figure 3:
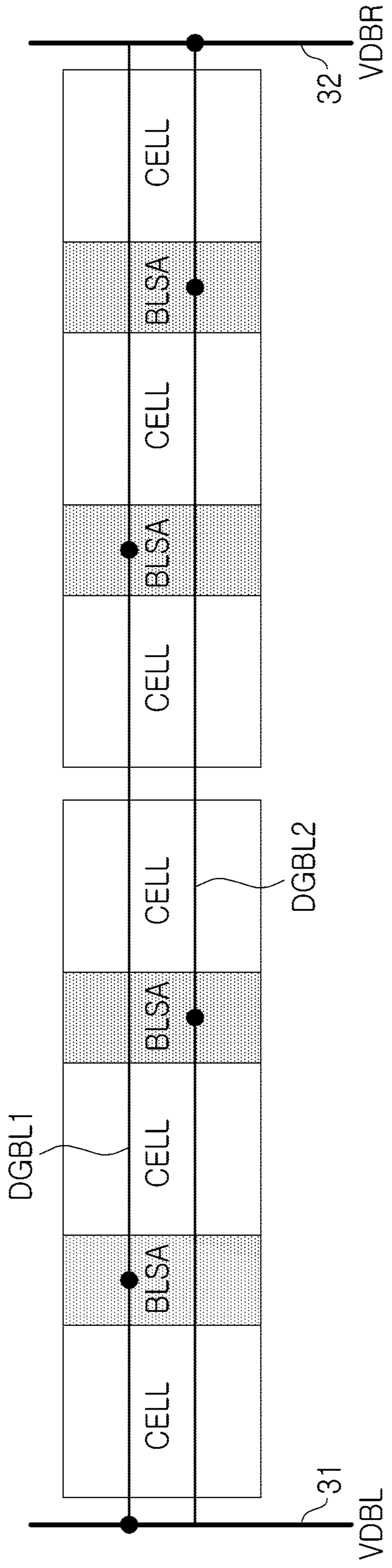
FIG. 3 is a block diagram illustrating an example of biasing a dummy global bitline in an even/odd local input/output line structure according to an example embodiment of the present disclosure.

FIG. 3 is a block diagram illustrating an example of biasing a dummy global bitline in an even/odd local input/output line structure according to an example embodiment of the present disclosure.

A first dummy global bitline DGBL1 may be connected to a first or left edge metal line 31. A first bias voltage VDBL may be applied to the first dummy global bitline DGBL1. The first dummy global bitline DGBL1 may be connected to an odd-numbered bitline sense amplifier BLSA. The first bias voltage VDBL may be applied to bias the first dummy global bitline DGBL1 by connecting a first layer of a cell region to a second layer of the bitline sense amplifier BLSA. In some embodiments, the first layer and the second layer may exist on the same layer. In some embodiments, the same layer refers to a layer having the same vertical height. In an example embodiment, the first layer may be a land pattern layer LP_DAM. In some embodiments, the land pattern layer LP_DAM may include a dummy line. In an example embodiment, the second layer may be a bottom poly layer BP.

A second dummy global bitline DGBL2 may be connected to a second or right edge metal line 32. A second bias voltage VDRR may be applied to the second dummy global bitline DGBL2. The second dummy global bitline DGBL2 may be connected to the even-numbered bitline sense amplifier BLSA. The second bias voltage VDBR may be applied to bias the second dummy global bitline DGBL2 by connecting the first layer of the cell region to the second layer of the bitline sense amplifier BLSA.

Figure 4:
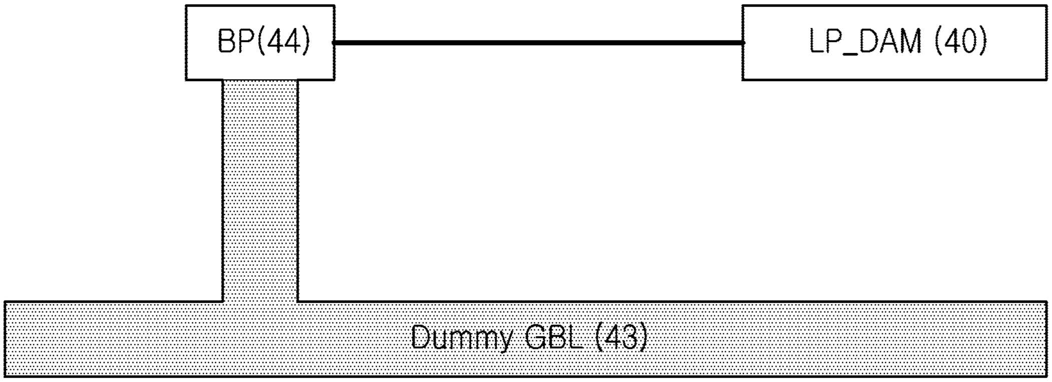
FIG. 4 is a block diagram illustrating a connection relationship for biasing a dummy global bitline according to an example embodiment of the present disclosure.

FIG. 4 is a block diagram illustrating a connection relationship for biasing a dummy global bitline 43 according to an example embodiment of the present disclosure. Referring to FIG. 4, the dummy global bitline 43 may be connected to a bottom poly layer BP 44. The bottom poly layer BP 44 may be connected to an LP_DAM 40 (or a 'dummy line') of the cell region existing on the same layer. In some embodiments, the same layer may be a layer having a height lower than that of layer of the metal line. That is, in a plan view of the memory device 100, the metal line is closer to the top of the memory device 100 (e.g., closest to the front of the view) than the same layer. In an example embodiment, each of the LP_DAM 40 and the BP 44 may include a conductive material.

In an example embodiment, the dummy global bitline 43 may be provided below LP_DAM (i.e., the first layer) and BP (i.e., the second layer), and a corresponding bias voltage may be applied to the dummy global bitline 43 without metal contact. That is, in a plan view of the memory device 100, the LP_DAM and the BP are closer to the top of the memory device 100 (e.g., closest to the front of the view) than the dummy global bitline 43

Figure 5:
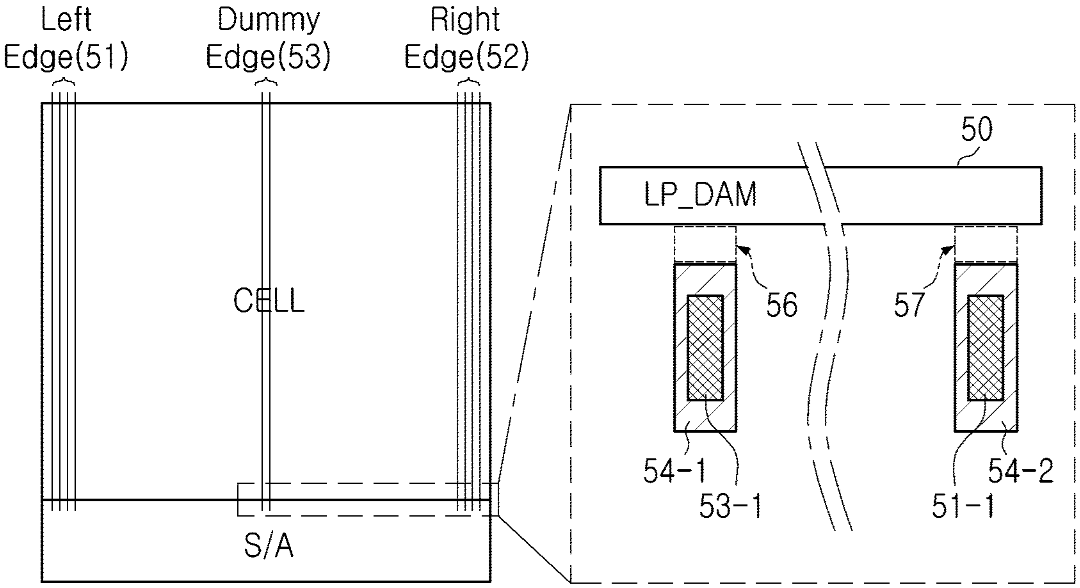
FIG. 5 is a block diagram illustrating a memory device having a quarter CSL structure according to an example embodiment of the present disclosure.

FIG. 5 is a block diagram illustrating a memory device having a quarter column selection line (CSL) structure according to an example embodiment of the present disclosure. Referring to FIG. 5, the memory device may include a cell region and a sense amplification region. A sense amplifier S/A may be connected to four global bitlines 51 at a first or left edge portion of the cell region, four global bitlines 52 at a second or right edge portion of the cell region, and two dummy global bitlines 53 at a central portion thereof.

A dummy global bitline 53-1 in a Quarter CSL (QCSL) region may be biased by connecting (56) a BP 54-1 (a 'second layer') to an LP_DAM 50 (a 'first layer'). The LP_DAM 50 may be connected (57) to a BP 54-2 of an L/R edge. The BP 54-2 may be connected to a global bitline 51-1. In an example embodiment, the BP 54-2 (a 'third layer') may be connected to a metal line to receive a bias voltage. Accordingly, the dummy global bitline 53-1 may be connected to the edge global bitline 51-1 through the LP_DAM of the cell region without a metal contact in an S/A region. The dummy global bitline 53-1 according to an example embodiment of the present disclosure may be biased to a specific voltage rather than in a floating state. As compared to conventional memory devices, the memory device according to an example embodiment of the present disclosure does not use a metal contact in an S/A region for biasing, thereby reducing the number of dummy global bitlines.

FIGS. 6A to 6E are views illustrating various example arrangements of the LP_DAM according to example embodiments of the present disclosure.

Figure 6A:
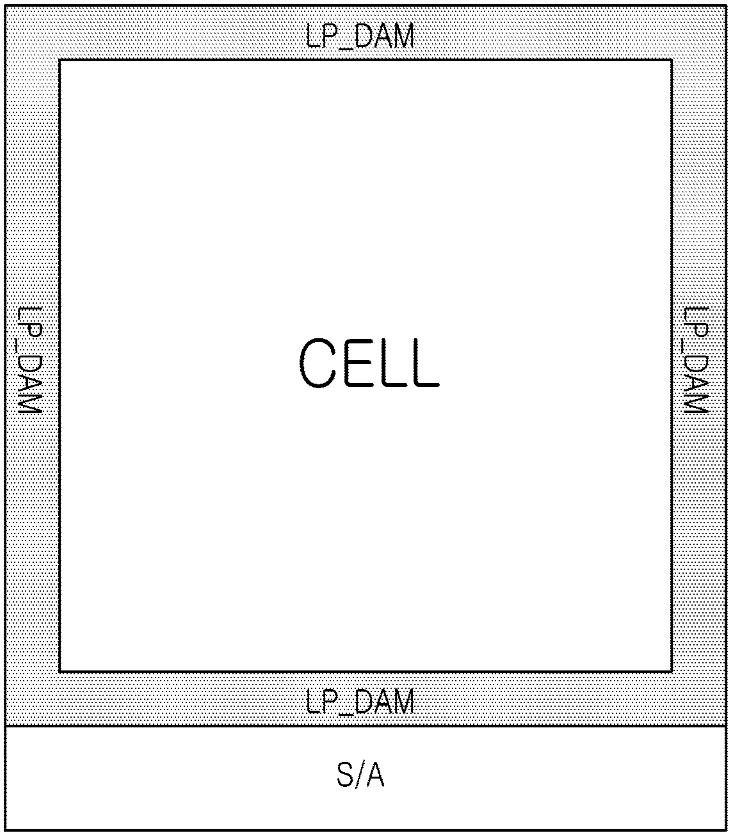
FIGS. 6A to 6E are views illustrating various example arrangements of LP_DAM according to example embodiments of the present disclosure.

Referring to FIG. 6A, the LP_DAM may be provided as a dummy line at an external edge of the cell region.

Meanwhile, the dummy line may be cut or may include a cut region to prevent or reduce the likelihood of a short circuit between the even/odd bitline sense amplifiers. Hereinafter, FIGS. 6B to 6E illustrate various embodiments of a cut LP_DAM.

Figure 6B:
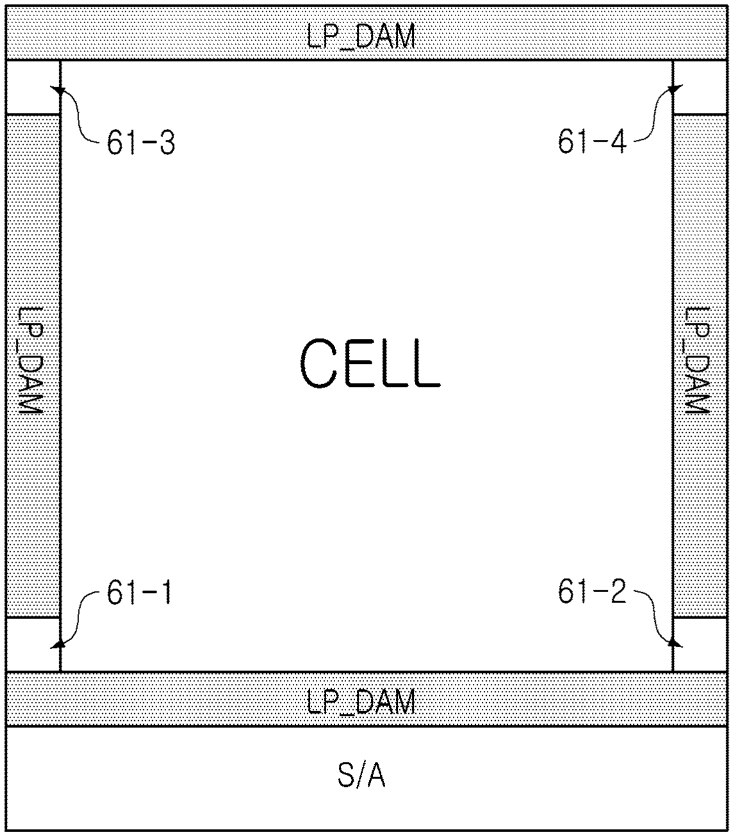

Referring to FIG. 6B, cut regions 61-1 and 61-2 may exist in an upper left portion and an upper right portion of the LP_DAM disposed adjacent to the sense amplifier S/A. Furthermore, cut regions 61-3 and 61-4 may exist in a lower left portion and a lower right portion of the LP_DAM disposed in parallel with the sense amplifier S/A.

Figure 6C:
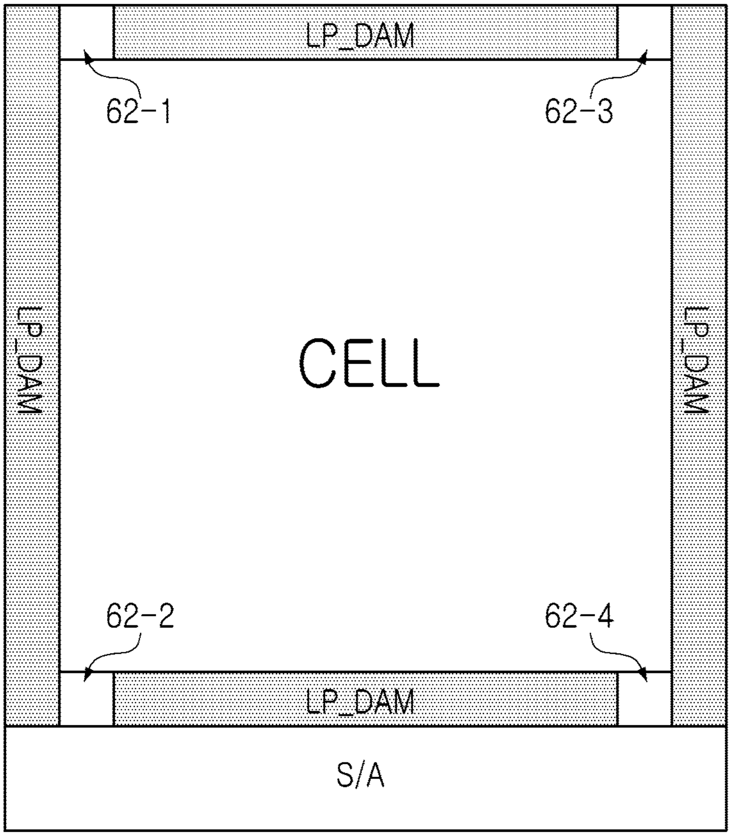

Referring to FIG. 6C, cut regions 62-1 and 62-2 may exist in the upper right portion and the lower right portion of the LP_DAM disposed perpendicular to a left edge portion of the sense amplifier S/A. Furthermore, cut regions 62-3 and 62-4 may exist in the upper left portion and the lower left portion of the LP_DAM disposed vertically on a right edge portion of the sense amplifier S/A.

Figure 6D:
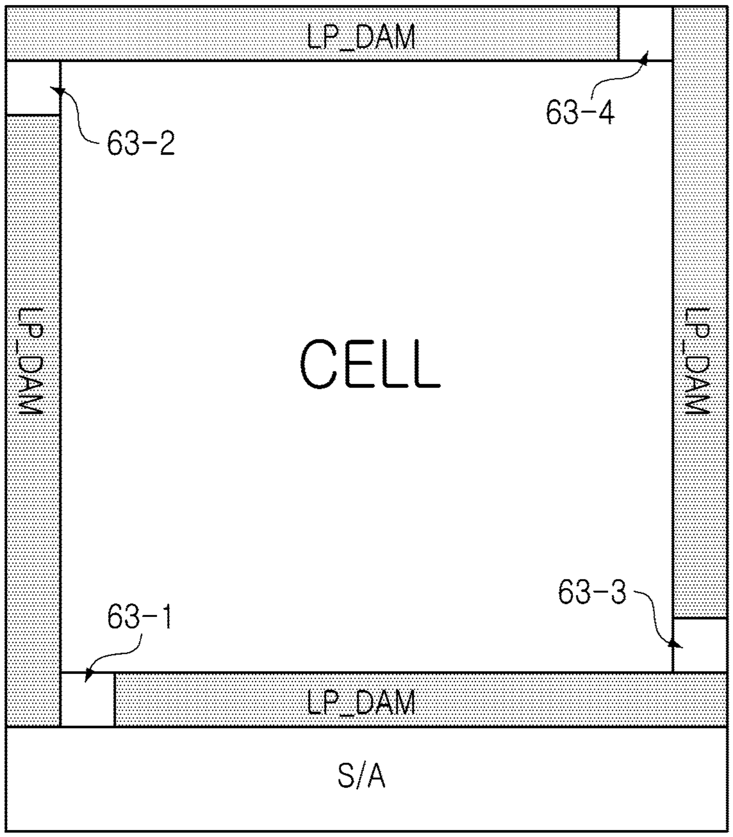

Referring to FIG. 6D, a cut region 63-1 may exist between the lower right portion of the LP_DAM disposed vertically adjacent to the left edge portion of the sense amplifier S/A and a left portion of the LP_DAM disposed adjacent to the sense amplifier S/A. A cut region 63-2 may exist in an upper portion of the LP_DAM disposed vertically adjacent to the left edge portion of the sense amplifier S/A and in the lower left portion of the LP_DAM disposed in parallel with the sense amplifier S/A. A cut region 63-3 may exist in a lower portion of the LP_DAM disposed vertically adjacent to the right edge portion of the sense amplifier S/A and in the upper left portion of the LP_DAM disposed adjacent to the sense amplifier S/A. A cut region 63-4 may exist in the upper left portion of the LP_DAM disposed vertically adjacent to the right edge portion of the sense amplifier S/A and in a right portion of the LP_DAM disposed in parallel with the sense amplifier S/A.

Figure 6E:
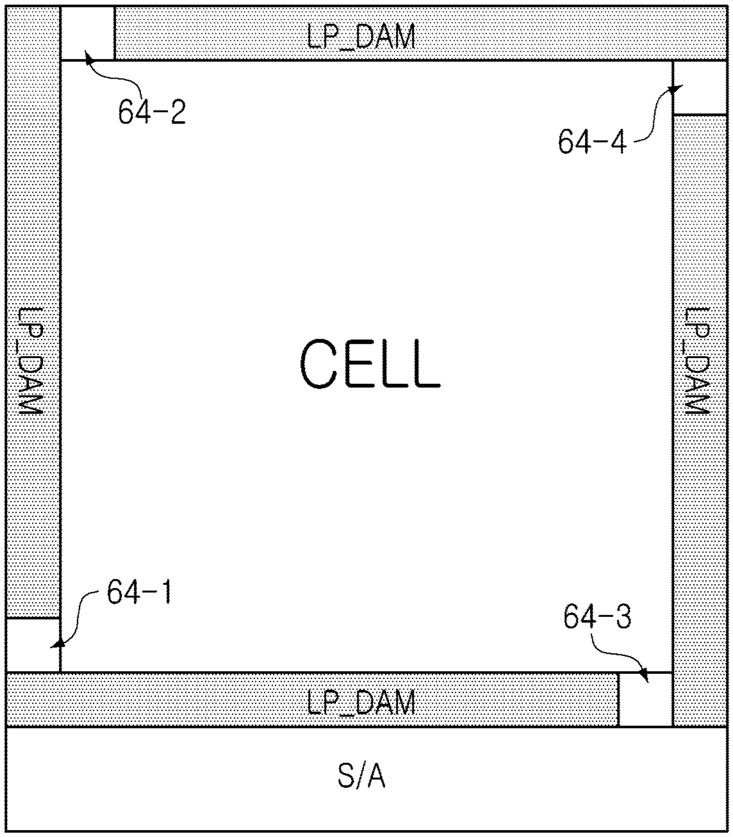

Referring to FIG. 6E, a cut region 64-1 may exist in the lower portion of the LP_DAM disposed vertically adjacent to the left edge portion of the sense amplifier S/A and in the upper left portion of the LP_DAM disposed adjacently to the sense amplifier S/A. A cut region 64-2 may exist in the upper right portion of the LP_DAM disposed vertically adjacent to the left edge portion of the sense amplifier S/A and in the left portion of the LP_DAM disposed in parallel with the sense amplifier S/A. A cut region 64-3 may exist in the lower left portion of the LP_DAM disposed vertically adjacent to the right edge portion of the sense amplifier S/A and in the right portion of the LP_DAM disposed adjacently to the sense amplifier S/A. A cut region 64-4 may exist in the upper portion of the LP_DAM disposed vertically adjacent to the right edge portion of the sense amplifier S/A and in the lower right portion of the LP_DAM disposed in parallel with the sense amplifier S/A.

Meanwhile, the memory device 100 according to an example embodiment of the present disclosure may be applied to a mobile device.

Figure 7:
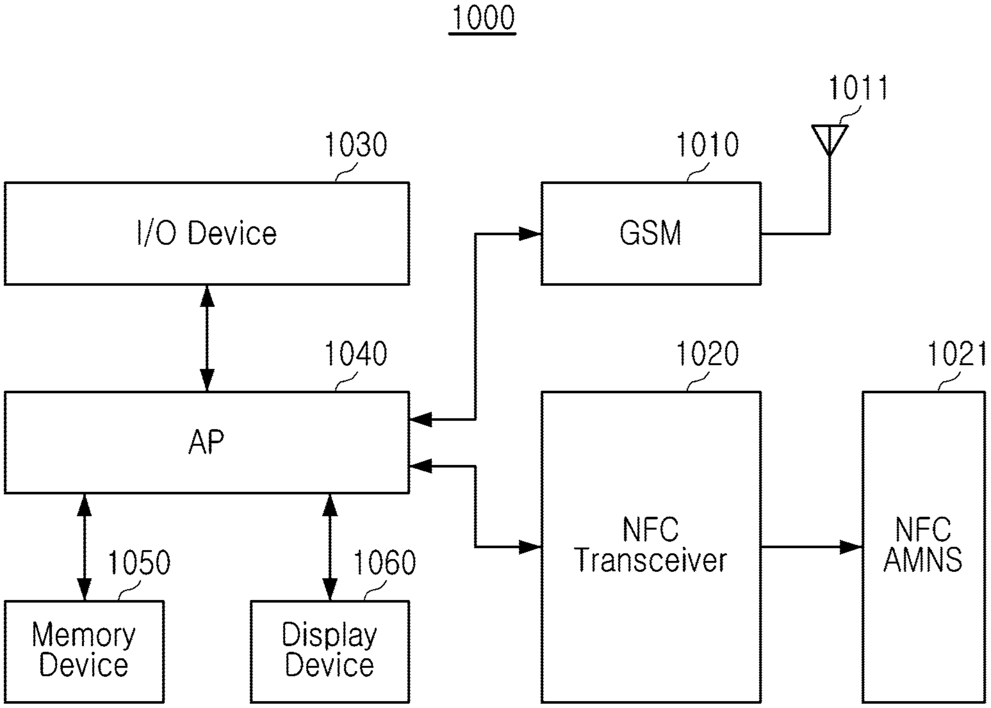
FIG. 7 is a block diagram illustrating a mobile device according to an example embodiment of the present disclosure.

FIG. 7 is a block diagram illustrating a mobile device according to an example embodiment of the present disclosure. In some embodiments, the mobile device may be a mobile phone or a smart phone. Referring to FIG. 7, a mobile device 1000 includes a global system for mobile communication (GSM) device 1010, a near field communication (NFC) transceiver 1020, an input/output device 1030, an application processor 1040, a memory device 1050, and a display device 1060. In FIG. 7, components/blocks of the mobile device 1000 are illustrated by way of example. The mobile device 1000 may include more or less components/blocks. Furthermore, although this example embodiment is illustrated as using GSM technology, the mobile device 1000 may be implemented using other technologies, such as code division multiple access (CDMA). The blocks of FIG. 7 may be embodied in the form of an integrated circuit. In other examples, some of the blocks may be embodied in the form of an integrated circuit, while others thereof may be embodied in a separate form.

The GSM device 1010 may be connected to an antenna 1011 and may be configured to operate to provide a wireless telephone capability in a known manner. The GSM device 1010 may be configured to perform corresponding reception and transmission operations by including a receiver and a transmitter therein. The NFC transceiver 1020 may be configured to transmit and receive NFC signals using inductive coupling for wireless communication. The NFC transceiver 1020 may be configured to provide NFC signals to an NFC antenna matching network system 1021, and the NFC antenna matching network system 1021 may be configured to transmit NFC signals through inductive coupling. The NFC antenna matching network system 1021 may be configured to receive NFC signals provided by other NFC devices and provide the received NFC signals to the NFC transceiver 1020.

An application processor 1040 may include hardware circuits, such as one or more processors, and may be configured to operate to provide various user applications provided by the mobile device 1000. The user applications may include, for example, voice call operations, data transmission, and data swap. The application processor 1040 may be configured to operate with the GSM device 1010 and/or the NFC transceiver 1020 and may be configured to provide operating characteristics of the GSM device 1010 and/or the NFC transceiver 1020. In some embodiments, the application processor 1040 may include a program for a point of sale (POS). Such a program may provide a credit card purchase and payment function using a mobile phone, that is, a smartphone.

The display device 1060 may be configured to display an image in response to display signals received from the application processor 1040. The image may be provided by the application processor 1040 or may be generated by a camera embedded in the mobile device 1000. The display device 1060 may internally include a frame buffer for temporary storage of pixel values, and may be comprised of a liquid crystal display screen along with related control circuits.

The input/output device 1030 may be configured to provide an input function to a user and to provide outputs to be received through the application processor 1040.

The memory device 1050 may be configured to store programs (commands) or data to be used by the application processor 1040, and may be implemented as a random access memory (RAM), a read only memory (ROM), and/or a flash memory. Accordingly, the memory device 1050 may include nonvolatile storage elements as well as volatile elements. In an example embodiment, the memory device 1050 may be implemented to bias the dummy global bitline by connecting the LP_DAM of the cell region to a BP of a sense amplifier region, as illustrated in FIGS. 1 to 6.

The device described above may be implemented as a hardware component, a software component, and/or a combination of a hardware component and a software component. For example, the devices and components described in this example embodiment may be implemented using one or more general purpose or special purpose computers, such as a processor, controller, an arithmetical logic unit (ALU), a digital signal processor, a microcomputer, a field programmable gate array (FPGA), a programmable logic unit (PLU), a microprocessor, or any other device capable of executing and responding to an instruction. A processing device may execute an operating system (OS) and one or more software applications running under the control of the operating system. Furthermore, the processing device may access, store, manipulate, process, and generate data in response to the execution of the software. For convenience of understanding, one processing device may be described as being used, but those skilled in the art may see that the processing device may include a plurality of processing elements or a plurality of types of processing elements. For example, the processing device may include a plurality of processors or one processor and one controller. In addition, other processing configurations, such as parallel processors are also possible.

The software may include a computer program, a code, an instruction, or combinations of one or more thereof, and may configure a processing device to operate as desired or may command a processing device independently or collectively. The software and/or data may be interpreted by the processing device or embodied in any type of machine, component, physical device, virtual device, or computer storage medium or device, to provide instructions or data to the processing device. The software may be distributed on network-connected computer systems and may be stored or executed in a distributed manner. The software and data may be stored in one or more computer-readable recording media.

A typical memory device, when implementing local input/output (LIO) separation in a 1K bitline sense amplifier (BLSA) center region, is biased through a configuration of four dummy Global Bit Lines (GBLs) in a cell region and a metal layer. If this configuration changes from four dummy GBLs to a reduction to two, a bias connection through the metal layer may be difficult. In such a case, due to the risk of insufficient test coverage, this two-GBL reduction may not be implemented.

On the other hand, embodiments of the present disclosure may achieve a chip size reduction (0.3 um/Cell_Block) and maintain test coverage by using a layout in which an LP_DAM and a BP Layer are connected in the same bias circuit connection configuration. This disclosure includes embodiments that relate to a memory device that separates even and odd LIO lines, and such embodiments may be configured with a quarter pitch of a center region CSL Tr. Pitch in a BLSA to accomplish this separation. The memory device described herein may be structured with a connection between LP_DAM and BP, and also an LP_DAM cut structure to prevent or reduce the likelihood of Bias L/R Short between S/A blocks within a semiconductor device structure for sensing data with the BLSA. Embodiments of the present disclosure may provide a memory device comprising a CELL BLK and the BLSA, which include a BP/LP_DAM layer with such a structure. Compared to CSL Tr. 1-Pitch (equivalent to eight dummy GBLs pitch), six dummy GBLs may be reduced. A quarter CSL region's Dummy GBL Bias LP_DAM and BP can be utilized and connected, resulting in a further reduction of 0.3 um (@100%)/Cell_Block compared to Half CSL.

The memory device according to embodiments of the present disclosure may bias the dummy global bitline using the land pattern layer of the memory cell area.

The above-described content of the present disclosure is merely specific example embodiments for implementing the present disclosure. The present disclosure will include technical concepts that are abstract and conceptual ideas to be used as technologies in the future, as well as specific and practically available means themselves.

What is claimed is:

1. A memory device comprising:

first global bitlines adjacent to a first edge portion of a memory cell region;

second global bitlines adjacent to a second edge portion of the memory cell region;

dummy global bitlines in a central portion of the memory cell region; and a bitline sense amplifier in a sense amplifier region and connected to the first global bitlines, the second global bitlines, and the dummy global bitlines, wherein a first layer of the memory cell region is connected to a second layer of the sense amplifier region, said connection being through a line different from a global bitline of the memory cell region, wherein the second layer of the sense amplifier region is connected to at least one dummy global bitline, and wherein by said connection of the first layer of the memory cell region to the second layer of the sense amplifier region, the first layer is configured to apply a bias voltage to the at least one dummy global bitline.

2. The memory device of claim 1, wherein a number of each of the first global bitlines and the second global bitlines is four.

3. The memory device of claim 1, wherein a number of the dummy global bitlines is two.

4. The memory device of claim 1, wherein the first layer and the second layer exist on a same layer.

5. The memory device of claim 1, wherein the first layer is a land pattern layer.

6. The memory device of claim 1, wherein the second layer is a bottom poly layer.

7. The memory device of claim 1, wherein the first layer is a land pattern layer and the second layer is a bottom poly layer, and wherein a placement of the land pattern layer is based on an external shape of the memory cell region.

8. The memory device of claim 7, wherein the land pattern layer includes at least one cut region.

9. The memory device of claim 8, wherein the land pattern layer includes a first land pattern layer adjacent to the sense amplifier region and a second land pattern layer arranged in parallel with the sense amplifier region, and wherein the at least one cut region includes at least one first cut region and at least one second cut region, the first land pattern layer and the second land pattern layer being between the at least one first cut region and the at least one second cut region.

10. The memory device of claim 1, wherein each of the dummy global bitlines is arranged below the first layer and the second layer in a plan view of the memory device, and wherein each of the dummy global bitlines is configured to supply a corresponding bias voltage to the first and second global bitlines without metal contact.

* * * * *